United States Patent

Hong

[11] Patent Number: 6,146,937
[45] Date of Patent: Nov. 14, 2000

[54] METHOD OF FORMING A DRAM DEVICE UTILIZING A SACRIFICIAL DOPED OXIDE LAYER

[75] Inventor: Gary Hong, Hsinchu, Taiwan

[73] Assignee: United Microelectronics Corp., Taiwan

[21] Appl. No.: 08/975,501

[22] Filed: Nov. 21, 1997

Related U.S. Application Data

[60] Provisional application No. 60/057,554, Aug. 29, 1997.

[51] Int. Cl.⁷ ............................................. H01L 21/8242
[52] U.S. Cl. ........................... 438/239; 438/254; 438/756
[58] Field of Search ..................................... 438/238, 239, 438/240, 241, 244, 253, 254, 396, 397, 756

[56] References Cited

U.S. PATENT DOCUMENTS

| | | | |
|---|---|---|---|
| 4,818,714 | 4/1989 | Haskell | 437/44 |
| 5,071,783 | 12/1991 | Taguchi et al. | 438/254 |
| 5,155,057 | 10/1992 | Dennison et al. | 438/254 |
| 5,244,826 | 9/1993 | Gonzalez et al. | 437/60 |
| 5,286,668 | 2/1994 | Chou | 438/254 |
| 5,374,577 | 12/1994 | Tuan | 438/254 |
| 5,686,337 | 11/1997 | Koh et al. | 437/52 |
| 5,851,872 | 12/1998 | Chen et al. | 438/253 |
| 5,854,105 | 12/1998 | Tseng | 438/253 |
| 5,989,956 | 11/1999 | Huang | 438/254 |

*Primary Examiner*—Olik Chaudhuri
*Assistant Examiner*—Kurt Eaton
*Attorney, Agent, or Firm*—Rabin & Champagne, PC

[57] ABSTRACT

A DRAM cell includes a transfer FET on a substrate and includes a charge storage capacitor formed using a process that avoids high temperature processing steps and which emphasizes low cost processes. The transfer FET is covered with a conformal sacrificial layer of doped oxide, preferably phosphorus silicate glass. A contact opening is formed through the layer of doped oxide to expose one of the source/drain regions of the FET and a doped polysilicon layer is deposited over the layer of doped oxide and in contact with the source/drain region. The layer of conductor is patterned to define the lateral extent of at least a portion of the lower electrode and then the doped oxide layer is removed from between the gate electrode and the polysilicon layer in a wet etching process. Particularly when this wet etching process removes the preferred phosphorus silicate glass sacrificial layer, this process can be accomplished at high speed and with minimal process complexity. Further processing provides a capacitor dielectric on upper and lower surfaces of the layer of conductor and provides an upper capacitor electrode.

30 Claims, 2 Drawing Sheets

METHOD OF FORMING A DRAM DEVICE UTILIZING A SACRIFICIAL DOPED OXIDE LAYER

This application claims the benefit of U.S. Provisional Application No. 60/057,554, filed Aug. 29, 1997.

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is accomplished using a transfer field effect transistor (FET). A contact between the bit line and the transfer FET is made to one of the source/drain electrodes of the transfer FET and the charge storage capacitor is formed in contact with the other of the source/drain electrodes of the transfer FET. Word line signals are supplied to the gate of the FET to selectively connect the lower electrode of the charge storage capacitor through the transfer FET to the bit line contact facilitating the transfer of charge between the charge storage capacitor and the bit line.

Applying reduced design rules to a DRAM reduces the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which is undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture.

SUMMARY OF THE PREFERRED EMBODIMENTS

It is accordingly an object of the present invention to provide a more manufacturable DRAM incorporating an increase capacitance charge storage capacitor.

Aspects of the present invention include a method of making an integrated circuit device on a substrate with a transfer field effect transistor on a surface of the substrate, the transfer field effect transistor having first and second source/drain regions and a gate electrode. The method includes covering the transfer field effect transistor with a layer of doped oxide and removing a portion of the layer of doped oxide to expose the first source/drain region. A layer of conductive material is provided over the layer of doped oxide so that the layer of conductive material is connected to the first source/drain region and extends over a surface of the layer of doped oxide. A first mask is provided on the layer of conductive material and the layer of conductive material is removed where exposed by the first mask. Wet etching removes the layer of doped oxide from below the layer of conductive material. A dielectric layer is formed over exposed surfaces of the first layer of conductive material and a conductive upper electrode is formed over the dielectric layer.

DETAILED DESCRIPTION OF THE PREFERRED EMBODIMENTS

According to particularly preferred embodiments, the present invention forms a DRAM with high capacitance charge storage capacitors using a process that reduces the number of conventionally necessary processing steps and which emphasizes low cost processes. Preferred embodiments of the present invention provide a transfer FET on a substrate and cover the transfer FET with a conformal sacrificial layer of doped oxide, preferably phosphorus silicate glass. A contact opening is formed through the layer of doped oxide to expose one of the source/drain regions of the FET and a layer of a conductor such as polysilicon is deposited over the layer of doped oxide and in contact with the source/drain region. The layer of conductor is patterned to define the lateral extent of at least a portion of the lower electrode and then the doped oxide layer is removed in a wet etching process. Particularly when this wet etching process removes the preferred phosphorus silicate glass sacrificial layer, this process can be accomplished at high speed and with minimal process complexity. Further processing provides a capacitor dielectric on upper and lower surfaces of the layer of conductor and provides an upper capacitor electrode.

Figure 1:
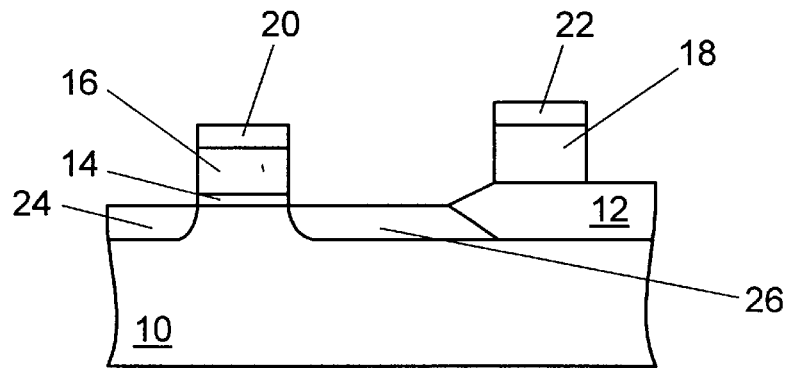
FIGS. 1–6 illustrate steps in forming a DRAM in accordance with preferred embodiments of the present invention.

Particularly preferred embodiments of the present invention are now described with reference to FIGS. 1–6. Many aspects of the manufacture of DRAMs are conventional and well known to those practicing in the art. As such, the following discussion omits certain of the details of the manufacturing process and presents in summary still other aspects of the manufacturing process to better emphasize the distinctive teachings of the present invention. FIG. 1 shows in schematic cross-section a single memory cell of a DRAM at an intermediate stage of manufacture. The DRAM cell incorporates a transfer field effect transistor (FET) with one source/drain region 26 of the transfer FET that will serve as a contact node for the lower electrode of a charge storage capacitor. The other source/drain region of the transfer FET will serve as a bit line contact for the DRAM cell in the illustrated bit line over capacitor configuration. The exemplary DRAM cell is formed on a P-type substrate 10 which has on its surface an array of field oxide device isolation regions 12 that provide isolation between the various memory cells and devices of the DRAM. The device isolation regions might be formed using a modified local oxidation of silicon (LOCOS) method, as schematically illustrated, or might be formed as shallow trench isolation structures. Shallow trench isolation structures might be formed by etching trenches into the substrate, refilling the trenches with oxide in a chemical vapor deposition (CVD) process, and planarizing the surface of the device in a chemical mechanical polishing (CMP) process.

Formation of the transfer FET for the illustrated DRAM cell commences by growing a gate oxide layer 14 on the active device region between the field oxide regions 12. The gate oxide layer 14 is grown on the surface of the substrate to a typical thickness of about 30–200 Å by thermal oxidation in an oxygen environment at a temperature of 800–1000° C. Soon after the gate oxide layer is grown, a layer of polysilicon is deposited by low pressure chemical vapor deposition (LPCVD) over the surface of the device to a thickness of 1000–3000 Å and more preferably to a thickness of approximately 1500–2500 Å. This polysilicon layer will be incorporated into the transfer FET gate electrodes 16 and wiring lines 18 shown in FIG. 1. The gate electrode polysilicon layer is either doped in situ during deposition or by ion implantation, typically using arsenic or phosphorus, followed by annealing in the conventional fashion. A layer of a metal or metal silicide might then be provided over the surface of the polysilicon layer to reduce the resistivity of the gate electrode and wiring line conductors. The metal layer is preferably tungsten silicide ($WSi_x$) or titanium silicide ($TiSi_x$) having a thickness of about 1500 Å which is preferably deposited directly by chemical vapor deposition or by using sputtering or another physical vapor deposition technique.

After the silicide layer is provided on the polysilicon layer, a layer of doped oxide, preferably a phosphorus silicate glass (PSG), includes approximately 5–10% phosphorus and is deposited over the silicide layer by CVD to a thickness on the order of 1000–3000 Å. This doped oxide layer protects the gate electrode during subsequent processing steps. Of much greater significance, however, is that this doped oxide capping layer forms part of a sacrificial doped oxide layer used to elevate the bottom surface of the lower capacitor electrode to a sufficient extent that, after the doped oxide layers are removed, a portion of an upper capacitor electrode can extend beneath the lower capacitor electrode. Doped oxide is particularly preferred because it can be removed rapidly in a wet etching process; phosphorus silicate glass is particularly preferred because processes for forming PSG are well understood and widely implemented and because PSG etches at a particularly high speed in a preferred HF based wet etchant. The use of appropriate materials and of low cost processes such as high speed wet etching allows DRAMs to be formed at low costs with high yields.

The gate electrode structure of doped oxide over a layer of conductor including a layer of polysilicon is then patterned using conventional photolithography to form an array of gate electrodes and wiring lines consisting of a lower layer of polysilicon 16, 18 covered by an optional layer of tungsten silicide or another refractory metal silicide (not shown), which in turn is covered by oxide layer (not separately shown). It should be noted that both more and less complicated gate electrode structures and wiring line structures might be used. The figures illustrate a simple gate electrode structure including a single layer of polysilicon 16. Similarly, the wiring lines include a lower layer of polysilicon 18 which might be covered by a layer of tungsten silicide or another refractory metal silicide and covered by the preferred doped oxide layer. Moderately doped source/drain regions 24, 26 are formed by ion implantation self-aligned to the gate electrode 16 and device isolation regions 12 in the conventional manner. For example, the source/drain regions might be formed by implanting arsenic or phosphorus ions at an energy of 30–100 KeV to a dosage of between about $1\times10^{13}/cm^2$ to $1\times10^{14}/cm^2$. In most DRAM applications, it is preferred to not utilize an LDD structure for the source/drain regions, particularly for the capacitor contacts, and instead to use a single doping to produce more uniformly doped source/drain regions.

Figure 2:
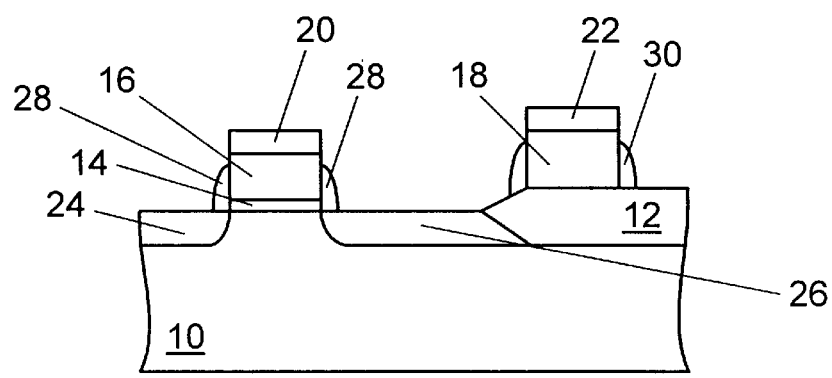

After the transfer FETs and wiring lines are formed, protective spacer structures 28 are formed along the sidewalls of the gate electrode 16 to protect the gate oxide 14 from the oxide etching steps preferably used for removing the sacrificial layer in accordance with embodiments of the present invention. Since these spacers 28 are preferably left in place in the finished DRAM cell, it is preferred that these spacers be formed from an insulating material. For those embodiments which utilize doped silicon oxide (e.g., PSG) as the sacrificial layer, it is preferred that these spacers 28 be formed from silicon nitride. It is desirable for the protective spacer structures to be different from the sacrificial oxide layer, for the reasons discussed above, and also for the protective spacer structures to be formed from a material different from that used as the capping layer 20, 22 that covers the polysilicon gate electrode 16 and wiring line 18. For this reason as well it is preferred that the spacer structures be silicon nitride. The spacer structures are formed by depositing a layer of silicon nitride over the surface of the FIG. 1 device, for example using CVD. Generally, the thickness of the silicon nitride layer deposited will determine the width by which the spacer structures extend from the gate electrodes. Depending on the particular device dimensions used in forming the DRAM cell, the silicon nitride layer might be deposited to a thickness of between about 100–2000 Å. An anisotropic etch back process is performed without a mask to form the spacer structures 28 on the sidewalls of the gate electrode 16 and on the sidewalls of the wiring line 18. The etching process might utilize a reactive ion etching process or another plasma driven process using an etchant derived from a source gas including, for example, $SF_6$. The etching process is continued for a sufficient amount of time so that the upper edges of the spacer structures 28 are below the lower edge of the capping layer 20 above the gate electrode 16, as shown in FIG. 2. Similarly, the spacer structures 30 formed on the sidewalls of the wiring lines 18 are etched sufficiently far so that the upper edges of the spacer structures 30 are below the lower edge of the capping layer 22.

A sacrificial layer or, if the capping layers are part of the sacrificial layer, an additional portion of the sacrificial layer is next provided over the FIG. 2 device. A layer 32 of doped silicon oxide, preferably PSG, is deposited by chemical vapor deposition (CVD) to a thickness of, for example, 500–2000 Å. PSG is a preferred material for the sacrificial layer because PSG etches about ten times faster than undoped oxide in the preferred wet etching systems of a dilute HF solution or a buffered oxide etch. A preferred doping level for the phosphorus doped oxide layer 32 and for phosphorus doped oxide capping layers 20, 22 is about 5–10% phosphorus. To optimize the wet etching rate, the doped oxide layer preferably is not subjected to a high temperature anneal.

Figure 3:
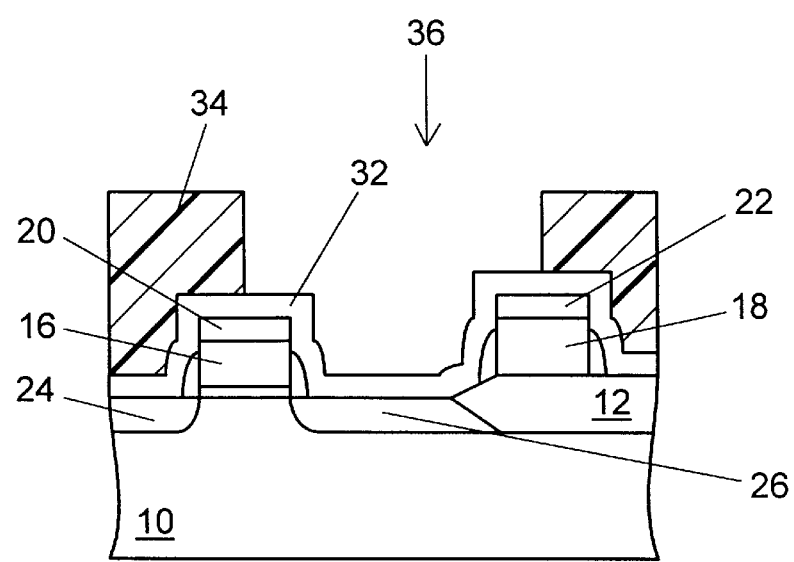
Figure 4:
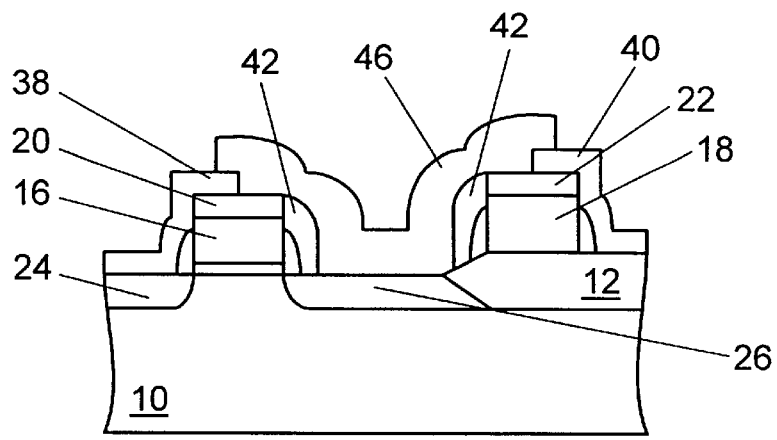
Figure 5:
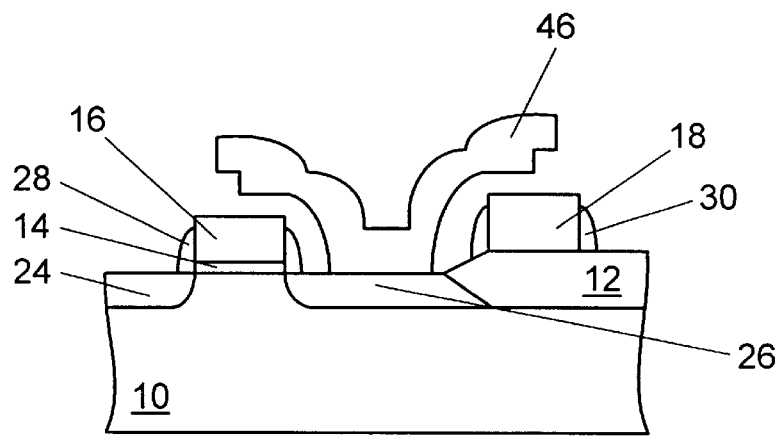
Figure 6:
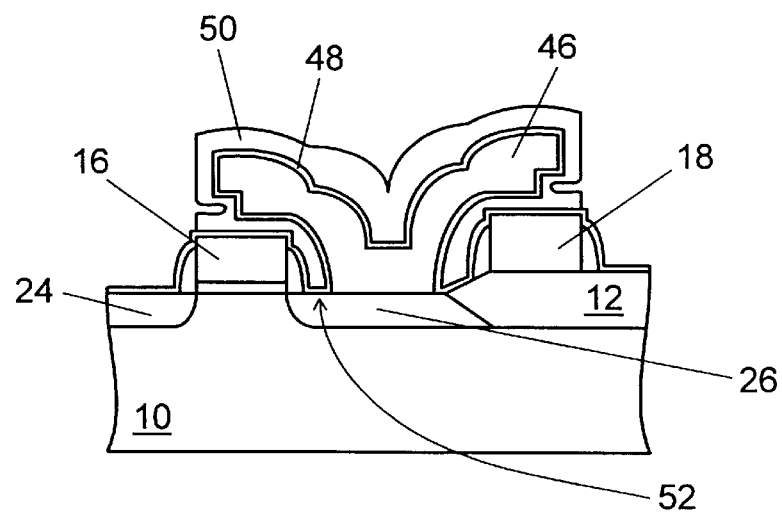

A contact opening is provided to expose a surface of a source/drain region 26 on which a portion of the lower electrode of the charge storage capacitor will be formed. A photoresist etch mask 34 is provided having an opening 36 over the doped oxide layer 32 above the source/drain region 26 on which the gate electrode will be formed. Neither the alignment nor the size of the opening 36 in the photoresist mask 34 is critical for the contact opening mask because a self aligned contact etching process is used in defining the contact opening. The opening 36 in the mask is preferably made larger than the desired contact size, as shown in FIG. 3. Then an oxide etch is performed across the opening 36 in the mask 34, with the oxide etch stopping on the surface of the source/drain region 26. Etching of the sacrificial oxide layer 32 preferably is performed in a reactive ion etching (RIE) process using an etchant including ions derived from $CF_4$ in a plasma environment. This etching process leaves behind portions 38, 40 of the sacrificial doped oxide layer surrounding the contact opening, creating a stepped topography that serves to increase the surface area of the lower capacitor electrode subsequently formed over the stepped structure. Also as a result of this self-aligned contact etch, additional doped oxide spacer structures 42 are left alongside the gate electrode 16 and the wiring line 18 in a manner that desirably defines an appropriate spacing between the gate electrode 16 and the wiring line 18 and the later formed lower capacitor electrode. The contact mask 34 is then stripped by, for example, ashing.

The lower capacitor electrode is then formed. A layer of polysilicon is deposited over the device in contact with the source/drain region 26. Preferably the polysilicon layer is doped in situ during deposition, although it is possible to use ion implantation and annealing to dope the lower capacitor electrode. The polysilicon layer is deposited by LPCVD to a thickness on the order of between about 1500–2500 Å. A mask is then provided on the polysilicon layer using conventional photolithography to cover at least the polysilicon layer over the source/drain region 26. Etching is performed using this mask to laterally define the lower capacitor electrode 46. The etching process may use an RIE process with a chlorine etch chemistry and preferably leaves a peripheral portion of the lower capacitor electrode above the remaining portions 38, 40 of the sacrificial oxide layer. The lower electrode definition mask is then removed. It should be noted that, while present embodiments prefer the use of a single doped polysilicon layer within the lower capacitor electrode, it is possible to form this structure using other materials such as titanium nitride or to add a surface layer onto the polysilicon layer to protect or otherwise alter the surface of the electrode 46.

After the lower capacitor polysilicon has been patterned, the sacrificial doped oxide layers 38, 40 and 42 are removed using a dilute hydrofluoric (HF) acid solution or a buffered oxide solution. When good access is provided to the lower portion of capacitor electrode, for example by incorporating the capping layers 28, 30 over the gate electrode 16 and the wiring line, this process proceeds rapidly and can be completed with a wet etch using a 20:1 dilution of HF ($H_2O$:HF) in approximately 20–60 seconds. Similar results can be obtained using a buffered oxide etch.

Next, a layer of capacitor dielectric material 48 is provided over all of the exposed surfaces of the lower charge storage capacitor electrode 46. A capacitor dielectric material might be provided by depositing a thin layer of (~30–50 Å) of CVD silicon nitride and growing a thin layer of oxide (~5–15 Å) on the nitride layer to form the dielectric material known as "NO." In particularly preferred embodiments of the present invention, a higher dielectric constant capacitor dielectric material is chosen. In an alternate embodiment, a layer of tantalum pentoxide, nominally $Ta_2O_5$, is deposited in a chemical vapor deposition (CVD) process from a source gas mixture consisting of Ta $(OC_2H_5)_5+O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 48 does not have unacceptable pin holes or an unacceptable breakdown voltage. Because the preferred capacitor dielectric layer is deposited at least in part by CVD, the capacitor dielectric layer 48 will typically extend over the surface of the gate electrode 16, wiring lines 18, and other parts of the device.

An upper capacitor electrode is next formed over the DRAM structure in accordance with preferred embodiments of the present invention. For most embodiments, the upper capacitor electrode 50 includes a layer of doped polysilicon deposited to a thickness of 1500–2500 Å. When a tantalum pentoxide capacitor dielectric is used, it is preferred that titanium nitride (TiN) be used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode 46. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a metal organic chemical vapor deposition (MOCVD) process. Titanium nitride can be deposited by MOCVD from $TiCl_4+NH_3$ source gases at a comparatively low substrate temperature. The MOCVD process has the further advantage over sputtering that MOCVD is much less likely to heat the deposition substrate during the deposition process. Processing continues to cover the upper capacitor electrode with an insulating layer, to form a bit line contact, and to complete the formation of the DRAM cell and support circuitry.

As a result of the particularly preferred processes used in forming the charge storage capacitor, both upper and lower surfaces of the lower capacitor electrode 46 are used for storing charge. Appropriate choices of device dimensions can form a charge storage surface 52 on the source/drain region 26 beneath the electrode 46, still further increasing the capacitance achieved through practice of the described methods.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of making an integrated circuit device comprising the steps of:

providing a substrate with a transfer field effect transistor on a surface of the substrate, the transfer field effect transistor having first and second source/drain regions and a gate electrode, including a capping layer;

forming a first spacer alongside the gate electrode, the first spacer being below a lowest edge of the capping layer;

covering the transfer field effect transistor with a layer of doped oxide;

removing a portion of the layer of doped oxide to expose the first source/drain region and to form a sacrificial doped oxide spacer, wherein the first spacer abuts on a sidewall of the gate electrodes, and the doped oxide spacer abuts on a sidewall of the capping layer and on the first spacer;

providing a layer of conductive material over the layer of doped oxide, the layer of conductive material being connected to the first source/drain region and extending over a surface of the layer of doped oxide;

providing a first mask on the layer of conductive material;

removing the layer of conductive material where exposed by the first mask;

wet etching to remove the doped oxide spacer so that the layer of conductive material contacts only the first source/drain region, and extends over but does not contact the gate electrode;

forming a dielectric layer over exposed surfaces of the layer of conductive material; and forming a conductive upper electrode over the dielectric layer.

2. The method of claim 1, wherein the wet etching step uses an etchant including hydrofluoric acid or which is derived from hydrofluoric acid.

3. The method of claim 1, wherein the doped oxide is doped with phosphorus.

4. The method of claim 2, wherein the doped oxide is doped with phosphorus at a concentration of 5–10%.

5. The method of claim 1, wherein the wet etching step continues until it reaches a surface of the first source/drain region.

6. The method of claim 5, wherein the conductive layer comprises doped polysilicon.

7. The method of claim 1, wherein the second source/drain region is connected to a bit line contact configured in a bit line over capacitor DRAM cell.

8. The method of claim 1, wherein the step of removing a portion of the layer of doped oxide to expose the first source/drain region comprises the steps of:

providing a contact mask having an opening extending above the gate electrode; and etching the doped oxide layer within the opening to remove doped oxide from above the gate electrode and to remove doped oxide from the first source/drain region, with the etching process stopping on the first source/drain region while leaving insulating material over the gate electrode.

9. The method of claim 1, wherein the gate electrode comprises a lower layer of polysilicon and a capping layer of doped oxide.

10. The method of claim 9, wherein the capping layer comprises phosphorus.

11. The method of claim 10, wherein the capping layer includes phosphorus at a concentration of 5–10%.

12. The method of claim 1, wherein the conductive upper electrode is separated from the layer of conductive material only by the dielectric layer and the conductive upper electrode is separated from the gate electrode only by the dielectric layer.

13. A method of making an integrated circuit devices comprising the steps of:

providing a substrate with a transfer field effect transistor on a surface of the substrate, the transfer field effect transistor having first and second source/drain regions and a gate electrode formed on a gate oxide layer, the gate electrode having a capping layer formed thereon;

forming first and second spacers alongside the gate electrode, the first and second spacers being below a lowest edge of the capping layer;

covering the transfer field effect transistor and the first and second spacers with a layer of doped oxide;

removing a portion of the layer of doped oxide to expose a portion of the first source/drain region, while retaining a first doped oxide portion on a portion of the top surface of the capping layer, and on a sidewall of the capping layer, and covering the first spacer, and retaining a second doped oxide portion that forms a doped oxide spacer which directly contacts the capping layer, wherein the second spacer abuts on a sidewall of the gate electrode, and the doped oxide spacer abuts on a sidewall of the capping layer and on the second spacer;

providing a layer of conductive material over the substrate, the layer of conductive material being connected to the first source/drain region, covering the doped oxide spacer, and extending over a surface of the first doped oxide portion;

providing a fist mask on the layer of conductive material;

removing the layer of conductive material where exposed by the first mask;

removing the first doped oxide portion, the capping layer, and the doped oxide spacer simultaneously, the first and second spacers acting to protect the gate oxide layer during the step of removing the first doped oxide portion, the capping layer, and the doped oxide spacer;

forming a dielectric layer over exposed surfaces of the first layer of conductive material; and forming a conductive upper electrode over the dielectric layer.

14. The method of claim 13, wherein the conductive upper electrode is separated from the layer of conductive material only by the dielectric layer and the conductive upper electrode is separated from the gate electrode only by the dielectric layer.

15. The method of claim 13, wherein the doped oxide is doped with phosphorus.

16. The method of claim 13, wherein the doped oxide is PSG with phosphorus at a concentration of 5–10%.

17. The method of claim 13, wherein the wet etching step continues until it reaches a surface of the first source/drain region.

18. The method of claim 13, wherein the gate electrode comprises a lower layer of polysilicon and the capping layer of doped oxide.

19. The method of claim 18, wherein the silicon nitride spacers have an upper edge lower than a lower edge of the capping layer.

20. The method of claim 19, wherein the capping layer is doped with phosphorus.

21. The method of claim 13, wherein the first and second spacers comprise silicon nitride spacers.

22. The method of claim 13, wherein the conductive layer comprises doped polysilicon.

23. The method of claim 13, wherein the step of removing the first doped oxide portion, the capping layer, and the doped oxide spacer comprises wet etching.

24. The method of claim 23, wherein the wet etching is performed with a dilute hydrofluoric acid solution.

25. The method of claim 23, wherein the wet etching is performed with a buffered oxide solution.

26. The method of claim 13, wherein the second source/drain region is connected to a bit line contact configured in a bit line over capacitor DRAM cell.

27. The method of claim 20, wherein the capping layer includes phosphorus at a concentration of 5–10%.

28. The method of claim 1, wherein said covering includes completely covering the gate electrode and the first source/drain region with the layer of doped oxide, and said removing a portion includes removing a further portion of the layer of doped oxide over the gate electrode while retaining another portion of the layer of doped oxide over the gate electrode.

29. The method of claim 28, wherein said wet etching removes all of the layer of doped oxide so that the first source/drain region is at least partially exposed, with the layer of conductive material being completely separated from the gate electrode by a free space that extends from the exposed first source/drain region to over the gate electrode.

30. The method of claim 29, wherein each of the steps is performed in the order given.

* * * * *